(12) United States Patent
Misra et al.

(10) Patent No.: US 7,098,150 B2
(45) Date of Patent: Aug. 29, 2006

(54) METHOD FOR NOVEL DEPOSITION OF HIGH-K MSION DIELECTRIC FILMS

(75) Inventors: Ashutosh Misra, Plano, TX (US); Matthew Fisher, Allen, TX (US); Benjamin Jurcik, Richardson, TX (US)

(73) Assignee: Air Liquide America L.P., Houston, TX (US)

( * ) Notice: Subject to any disclaimer, the term of this patent is extended or adjusted under 35 U.S.C. 154(b) by 0 days.

(21) Appl. No.: 10/939,269

(22) Filed: Sep. 10, 2004

(65) Prior Publication Data
US 2005/0196970 A1 Sep. 8, 2005

Related U.S. Application Data

(60) Provisional application No. 60/550,908, filed on Mar. 5, 2004.

(51) Int. Cl.
*H01L 21/31* (2006.01)
*H01L 21/469* (2006.01)

(52) U.S. Cl. ............... 438/778; 438/287; 438/907

(58) Field of Classification Search ............ 438/287, 438/778, 786, 907
See application file for complete search history.

(56) References Cited

U.S. PATENT DOCUMENTS

| | | | | |
|---|---|---|---|---|
| 6,013,553 A | * | 1/2000 | Wallace et al. | 438/257 |
| 6,399,208 B1 | | 6/2002 | Baum et al. | 428/446 |
| 6,797,599 B1 | * | 9/2004 | Visokay et al. | 438/586 |
| 2003/0207549 A1 | | 11/2003 | Jeng | 438/582 |
| 2003/0207552 A1 | | 11/2003 | Saito et al. | 438/582 |

FOREIGN PATENT DOCUMENTS

JP 2000-272283 8/2000

* cited by examiner

*Primary Examiner*—Phuc T. Dang
(74) *Attorney, Agent, or Firm*—Elwood Haynes; Brandon Clark

(57) ABSTRACT

This disclosure discusses the forming of gate dielectrics in semi conductor devices, and more specifically to forming thin high-k dielectric films on silicon substrates typically using chemical vapor deposition or atomic layer deposition processes. The current invention forms a high-k dielectric film in a single film-forming step using a vapor phase silicon precursor in conjunction with a liquid phase metal precursor, a nitrogen source and an oxygen source for the deposition of a metal silicon oxy nitride (MSiON) film of desired stochiometry. The vapor phase silicon precursor is not coordinated to a metal allowing independent control over feeding of the metal source and the silicon source. Thus, the M/Si ratio can be easily varied over a wide range. Furthermore, the vapor phase silicon precursor, liquid phase metal precursor, nitrogen source and oxygen sources are chlorine free, eliminating the undesirable effects chlorine in the dielectric film and chloride by products in the reaction chamber and exhaust system. Furthermore, the vapor phase silicon precursor, nitrogen source and oxygen sources are carbon free, minimizing the incorporation of carbon in the dielectric film.

21 Claims, 1 Drawing Sheet

METHOD FOR NOVEL DEPOSITION OF HIGH-K MSION DIELECTRIC FILMS

CROSS-REFERENCE

This application is related to and claims the benefit of U.S. Provisional Application No. 60/550,908, filed Mar. 5, 2004, entitled "Composition And Method For Deposition Of High-k Dielectric Films."

BACKGROUND

Manufacturing of semiconductor devices employs a thin gate dielectric (typically silicon dioxide) between the underlying silicon substrate and the gate electrode. Depositing a thin dielectric film on a silicon substrate forms a gate dielectric. Typical processes for growth of dielectric films include oxidation, chemical vapor deposition and atomic layer deposition processes. As integrated circuit devices shrink, the thickness of the gate dielectric needs to shrink proportionally. However, semiconductor manufacturers have reached the limit to which the thickness of conventional gate dielectric materials can be decreased without compromising the electrical characteristics. Rather than degrading the dielectric properties by using a silicon dioxide dielectric that is only a few atomic layers thick, equivalent dielectric performance can be achieved by substituting the silicon dioxide for a thicker layer of a new material exhibiting a higher dielectric constant. Therefore, new compositions or methods to produce a dielectric film with a higher dielectric constant than silicon dioxide (referred to as "high-k dielectrics") are required. These "high-k dielectrics" must have a low leakage current through the gate dielectric. Thus, it is desirable to develop new compositions and methods of depositing dielectric films with the required higher dielectric properties so that films with more than one or two layers of atoms can be deposited. Due to the requirements for thin dielectric films, having uniform coverage of material that is very high quality is critical to the performance of the gate dielectric.

Of particular interest is the formation of metal silicon oxynitride ("MSiON") films. Forming a MSiON dielectric film typically involves feeding a metal source, a silicon source, an oxygen source and a nitrogen source (collectively referred to herein as the "dielectric precursors") in the proper relative amounts to a deposition device wherein a silicon substrate is held at an elevated temperature. The dielectric precursors are fed to a deposition chamber through a "delivery system." A "delivery system" is the system of measuring and controlling the amounts of the various dielectric precursors being fed to the deposition chamber. Various delivery systems are known to one skilled in the art. Once in the deposition chamber, the dielectric precursors react to deposit a dielectric film on the silicon substrate in a "forming" step. A "forming" step or steps, as used in this application, is the step or steps wherein materials are deposited on the silicon substrate or wherein the molecular composition or structure of the film on the silicon substrate is modified. The "desired final composition" of the dielectric film is the precise chemical composition and atomic structure of the gate dielectric after the last forming step is complete. Compounds of hafnium, such as hafnium oxides, hafnium silicates and hafnium silicon oxy nitrides are currently the most promising high-k gate dielectric choices. The metal source for the forming process is typically a liquid precursor solution containing the desired metal in a solvent. Similarly, the silicon sources available in the art prior to the current invention typically use a liquid precursor containing the desired silicon compound in a solvent.

U.S. Patent Publication No. U.S. 2003/0207549, PAJ Patent Application No. 2000272283, U.S. Pat. No. 6,399,208, and U.S. Patent Publication No. 2003/0207549 disclose information relevant to forming dielectric films. However, these references suffer from one or more of the disadvantages discussed below.

Some gate dielectric-forming processes require multiple forming steps. For instance, a dielectric film may be formed by depositing a metal and silicon on a substrate in a first step followed by a second "post deposition step" wherein the composition or structure of the deposited metal/silicon film is modified to achieve the desired final composition of a MSiON gate dielectric film. An example of a post deposition step is rapid thermal annealing in an environment that is filled of nitrogen or ammonia. Because control of the film composition is important in dielectric film deposition processes, the fewer the steps, the better the control of the process, and the higher the quality (reflected by dielectric constant, density, contamination, composition and other quality control properties) and conformality (the ability of the film to evenly deposit on all surfaces and shapes of substrate) of the dielectric film.

It is known in the art that any silicon sources that contain carbon in the ligands can lead to carbon in the film and result in degraded electrical properties. Furthermore, any chlorine incorporated in dielectric films is undesirable due to its harmful effect on the electrical properties of the film and the stability of the chlorine in the film (the stability makes it hard to remove chlorine from the dielectric film). Also, the presence of chlorine in the silicon or metal source results in the generation of chloride based particulates in the reaction chamber and deposits in the exhaust system. Thus, to achieve the ideal electrical properties and to minimize particulate generation and tool downtime due to exhaust system cleaning, it is desirable to deposit dielectric films from precursors free of carbon or chlorine in the atomic structure.

The physical properties of a MSiON dielectric film are affected by the metal (M) to silicon (Si) ratio, or M/Si. It is desirable to be able to control the M/Si ratio over a broad range. Thus, it is important to be able to vary the metal and silicon feed independently to achieve the broadest possible M/Si ratios. Some processes use a silicon source precursor that also contains some amount of the metal that is to be deposited. The problem encountered is that changes in the metal-containing silicon source precursor feed rate changes the total amount of the metal fed to the process (due to the metal contained in the silicon precursor). This limits the controllability of the deposition process because the silicon feed rate cannot be changed without also affecting the total amount of metal being fed to the deposition chamber. Furthermore, the ratio of M/Si that can be fed is limited by the composition of the metal in the silicon source precursor. Thus a change in desired M/Si ratio can require changing precursor solutions being fed to the process.

Vaporizing silicon precursor streams can also lead to problems with film composition control. Referring to FIG. 2, some processes in the art use a vaporizer to vaporize the liquid silicon source. The vaporized stream is then fed to the deposition chamber. When the metal source and the silicon source are supplied in liquid form, they must both be vaporized before being introduced into the deposition chamber. Vaporizing two different streams can lead to variable feed concentrations and formation of silicon or metal residues in the vaporizer that can adversely affect the conformality of the film composition. Differences in vaporization of the silicon and metal sources can also lead to compositional gradients in the dielectric.

Bubbling a carrier gas through a liquid precursor can also cause quality problems. In some processes, a silicon source is fed by bubbling a carrier gas through a liquid silicon source. A vaporizer is not used in these processes because the vapor pressure of the silicon source is high enough to be transported as a vapor in a mixture with the carrier gas. In these processes, the composition of the stream transporting the silicon source to the deposition chamber can vary with temperature and pressure in the bubbling system. This variability in stream composition leads to variability in the composition of the dielectric film, which is a significant quality control issue.

For the foregoing reasons, it is desirable to form a dielectric film of the final desired composition in a single forming step. Furthermore, the film should be free of any chlorine and contain as little carbon as possible in the molecular structure. It is also desirable to use a silicon source that is free of any deposition metals so the silicon source feed and the metal source feed may be independently controlled. Finally, it is desirable to have a silicon source that is in the vapor phase at process feed conditions to avoid the need to vaporize a liquid silicon source or bubble a carrier gas through a liquid source.

SUMMARY

The current invention is directed to methods and compositions that satisfy the need to form a thin MSiON dielectric film with high electrical qualities (large dielectric constant and low leakage current), and high conformality. The current invention avoids using multiple forming steps to assure uniform coverage and high conformality. Furthermore, the current invention provides a film that is free of chlorine and contains a minimum amount of carbon, both of which can degrade the electrical properties of the film. In addition, the current invention provides the ability to control the M/Si ratio in MSiON films over a broad range without changing precursor solutions. Finally, the current invention avoids the quality and conformality issues that can occur when vaporizing a liquid precursor solution containing multiple components or bubbling a carrier gas through a liquid silicon source.

The high-k MSiON dielectric film of the current invention is formed by vaporizing a metal source followed by feeding a plurality of dielectric precursors (dielectric precursors being the vaporized metal source, a silicon source, an oxygen source, and a nitrogen source) to a deposition device, and forming a dielectric film with the desired final composition in a single forming step. In other words, there is no need for a post deposition step to achieve the desired final composition the dielectric film. Feeding of a plurality of dielectric precursors to the deposition device is effectively concurrent. The high-k dielectric film forms on a silicon substrate in a single forming step without using a post deposition step to adjust the composition of the dielectric precursors in the dielectric film. The resulting high-k dielectric film has the desired MSiON composition, is absent chlorine, and the carbon incorporation is minimized to provide the highest quality dielectric properties.

The current invention uses a vapor phase silicon precursor in conjunction with a liquid phase metal precursor for the deposition of MSiON films of desired stochiometry. The vapor phase silicon precursor is sufficiently volatile at temperatures above 15° C. to supply the process as a vapor without bubbling a carrier gas through a liquid or heating in a vaporizer. This eliminates the control and quality problems associated with having to vaporize two precursors (a metal containing precursor and a silicon containing precursor) or bubble a carrier gas through a liquid to feed the silicon source. In addition, the vapor phase silicon precursor is not coordinated to a metal allowing independent control over feeding of the metal source and the silicon source. Thus, the M/Si ratio can be easily varied over a wide range without having to mix new precursor solutions and recalibrate the process to the new precursor mixture. Furthermore, the vapor phase silicon precursor is carbon and chlorine free, eliminating the undesirable effects of carbon and chlorine in the dielectric film. Finally, the current inventive method produces a dielectric film of the desired final composition is a single step.

The metal source in a MSiON film is typically a liquid precursor solution. The liquid phase precursor is injected into a system that vaporizes it into a gas phase. The vaporized precursor enters the deposition chamber where deposition occurs at an elevated temperature.

The silicon source of a MSiON film of the current invention is injected into the deposition chamber effectively concurrent with the vaporized metal precursor. The silicon source is in the vapor phase at process feed conditions. That is, the silicon source flows from the source container through the feed measurement and control system as a vapor without the need to be vaporized or without using a carrier gas. However, a gas phase inert may be used to dilute the silicon mixture if needed to obtain accurate flow measurements. Furthermore, the silicon source does not have any atoms of carbon, chlorine, or deposition metals in the molecular structure of the compound. Preferred silicon sources that are carbon and chlorine free are, but are not limited to, the following compounds or mixtures of the following compounds:

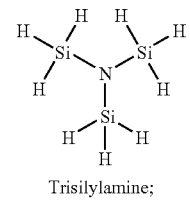

Trisilylamine;

1)

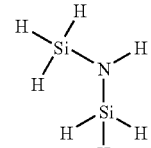

Disilylamine;

2)

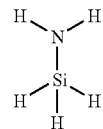

Silylamine;

3)

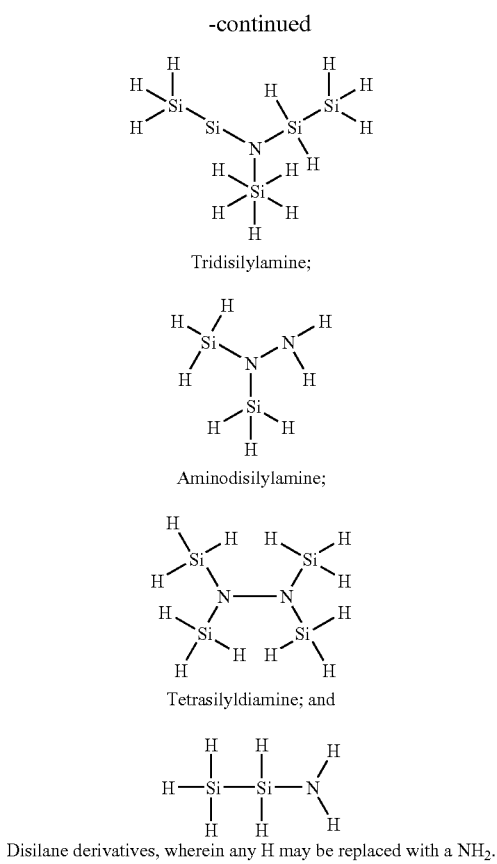

4) Tridisilylamine;

5) Aminodisilylamine;

6) Tetrasilyldiamine; and

7) Disilane derivatives, wherein any H may be replaced with a $NH_2$.

The oxygen and nitrogen sources are also injected into the deposition chamber concurrently with the vaporized metal source and the silicon source. Preferred oxygen and nitrogen sources are free of carbon and/or chlorine in their molecular structures.

The reaction of the dielectric precursors in the deposition chamber leads to the formation of a MSiON film on the silicon substrate. The composition of the dielectric film can be precisely controlled by precisely controlling the flow rates of each of the dielectric precursors independently. In a MSiON film, the feed rates of the silicon and metal sources are independently controllable, thus the M/Si ratio of the resulting dielectric film is controllable over a wide range without changing the composition of the metal source or the silicon source.

The reaction of the dielectric precursors in the deposition chamber forms a dielectric film of the desired final composition in a single reaction step. There is no requirement for a post deposition step wherein the composition of the dielectric film is modified by a step after the dielectric precursors are deposited on the substrate.

Because the silicon, oxygen and nitrogen sources in this invention are all carbon and chlorine free, the resulting dielectric film has excellent properties, including a high dielectric constant when combined with a suitable metal in the proper ratio.

DESCRIPTION

The present invention is directed to a method of forming and composition of a high-k MSiON dielectric film on semiconductor pieces. The present invention is applicable to chemical vapor deposition and atomic layer deposition processes as well as others known to one skilled in the art.

Figure 1:
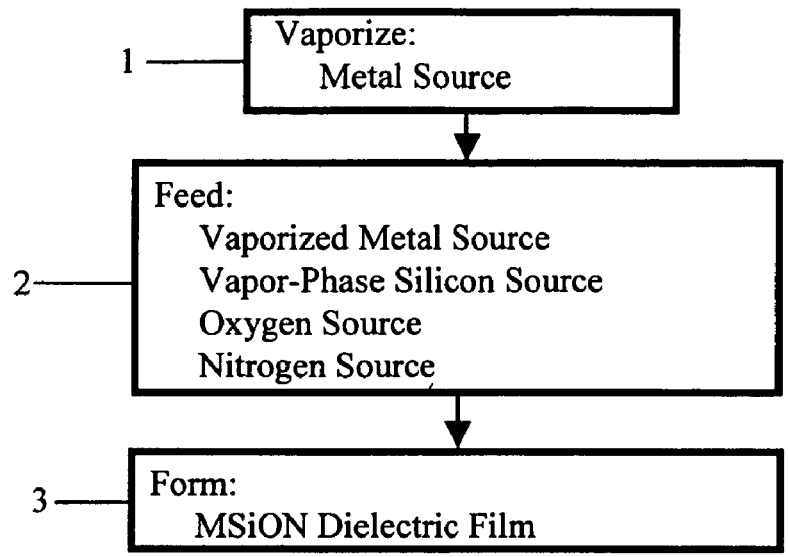
FIG. 1 is a flow chart of the steps of the method for forming a MSiON dielectric film.
Figure 2:
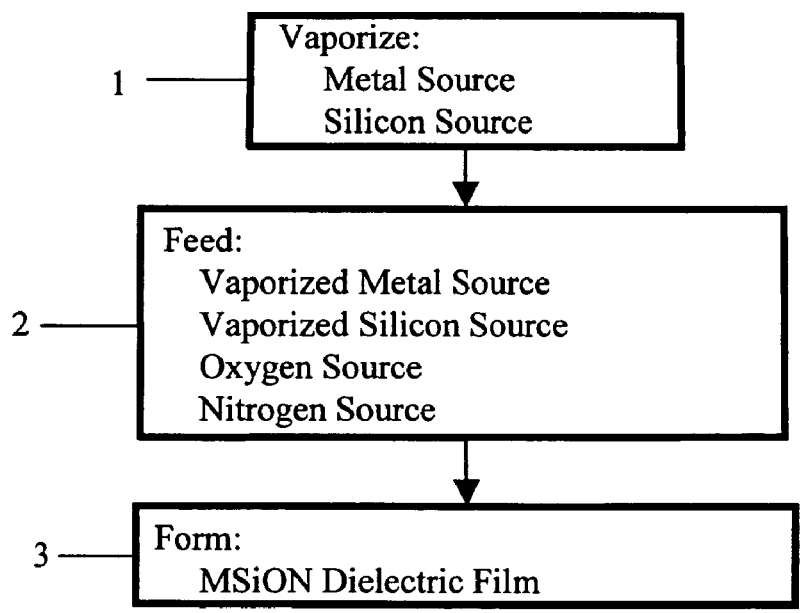
FIG. 2 is a flow chart of a Prior Art method for forming a MSiON dielectric film.

Referring to the MSiON method of FIG. 1, the vaporizing step 1 comprises vaporizing a metal source to form a vaporized metal source. The metal source of one preferred embodiment is a precursor solution in liquid phase, preferably a dialkylamino, an alkoxy, or an inorganic compound of hafnium (Hf), zirconium (Zr), lanthanum (La), yitrium (Y), gadolinium (Gd), europium (Eu), or praseodymium (Pr). Preparing and vaporizing the liquid phase metal precursor solution is carried out in commercially available equipment under appropriate conditions known to one skilled in the art.

Referring again to the MSiON method of FIG. 1, during the feed step 2 a silicon source, an oxygen source, and a nitrogen source (collectively referred to as the dielectric precursors) are fed to a deposition chamber where a silicon substrate (on which deposition is needed) is placed at an elevated temperature. The deposition chamber is typically maintained between about 300 to about 900° C. Preferably the surface of the work piece in the deposition chamber will be between about 500 to about 600° C. The feeding of the dielectric precursors is effectively concurrent (atomic layer deposition involves high-speed sequential pulses of feed materials, which for the purposes of this invention is effectively concurrent).

Referring to the MSiON method of FIG. 1, during the feed step 2 of the MSiON method, the silicon source is controllably injected into the deposition chamber effectively concurrent with the vaporized metal source and the other dielectric precursors or silicon film components. In one preferred embodiment, a silicon source is in the vapor phase at process feed conditions. That is, the silicon source of one preferred embodiment has a vapor pressure of greater than approximately 50 torr at 20° C., sufficient to exist in the vapor phase in the feed control system without the need for vaporization or bubbler equipment in the delivery system. Trisilylamine, one preferred silicon source, may be stored as a liquid, but has sufficient vapor pressure (greater than 350 torr vapor pressure at 20° C.) to be in the vapor phase in the delivery system without the need to use a vaporizer or bubbler system. Because the silicon source is in the vapor phase, it can be accurately measured and controlled with conventional devices know in the art, and is not affected by deposits in a vaporizer or swings in feed conditions during vaporization of the silicon or metal source.

Still referring to the MSiON method of FIG. 1, preferred embodiments of the feed step 2 include, but are not limited to, the use a silicon source absent carbon or chlorine in the molecular structure. Thus, the dielectric film has a minimum amount of contained carbon and is free of chlorine, resulting in the optimum electrical properties.

Still referring to the MSiON method of FIG. 1, preferred embodiments of the feed step 2 include, but are not limited to, feeding the oxygen and nitrogen sources into the deposition chamber concurrently with the silicon source. Furthermore, the vaporized metal source is also fed concurrently in the feed step 2. Various preferred embodiments of the MSiON method use nitrogen sources that are free of carbon and/or chlorine in their molecular structures. It is not required that nitrogen be fed as a separate stream. The nitrogen source can be the same as the metal source, the silicon source, or the oxygen source. Preferred oxygen sources of the current invention are also free of carbon and/or chlorine in their molecular structures. Preferred embodiments include, but are not limited to oxygen, nitrous oxide, or ozone as the oxygen source. The nitrogen source of one preferred embodiment is ammonia. The oxygen and nitrogen sources are fed and controlled with devices known to one skilled in the art.

Referring again to the MSiON method of FIG. 1, the deposition and reaction of dielectric precursors in the deposition chamber leads to the formation of a MSiON film on the heated silicon substrate during the forming step 3. One preferred embodiment of a MSiON film is a hafnium silicon oxynitride film or a zirconium silicon oxynitride film formed by feeding a hafnium or zirconium metal using a mixture of a metal source (such as Hf(DEA)$_4$ or Zr(DEA)$_4$), trisilylamine, ammonia and nitrous oxide.

Referring again to the MSiON method of FIG. 1, the composition of the MSiON dielectric film can be controlled by varying the flow of each of the dielectric precursors independently during the feeding step 2. Particularly, the feed rate of the silicon source and the metal source are independently controllable because the silicon source does not contain any deposition metals. Thus, the silicon source feed rate can be varied independently of the metal source feed rate to affect the desired metal (M) to silicon (Si) ratio. Similarly, the metal source feed rate can be varied without affecting the silicon source feed rate, also changing the M/Si ratio. Because the feed rate of the silicon and metal sources are independently controllable, the M/Si ratio of the resulting dielectric film is controllable over a wide range without changing the composition of the metal source or the silicon source.

Referring to the MSiON method of FIG. 1, the feeding of the dielectric precursors to the deposition chamber results in the formation of a dielectric film of the desired final composition in a single forming step 3. There is no requirement for a post deposition step wherein the composition or structure of the dielectric film is modified after some or all of the dielectric precursors are deposited on the substrate to achieve the desired final composition.

Although the present invention has been described in considerable detail with reference to certain preferred versions thereof, other versions are possible. For example, the composition and method may be practiced in a process other then chemical vapor deposition or atomic layer deposition. In addition, the deposition of dielectric films can be accomplished at a variety of temperature and conditions. Furthermore, the invention may include a variety of metal, silicon, oxygen and nitrogen sources known in the art. Therefore, the spirit and scope of the appended claims should not be limited to the description of one of the preferred versions contained herein. The intention of the applicants is to cover all modifications, equivalents, and alternatives falling within the spirit and scope of the invention as defined by the appended claims.

What is claimed is:

1. A method for forming a MSiON dielectric film comprising the steps of:
    vaporizing a metal source to form a vaporized metal source;
    feeding a plurality of dielectric precursors to a deposition device, wherein said dielectric precursors comprise said vaporized metal source, a silicon source, an oxygen source, and a nitrogen source; and
    forming a dielectric film, wherein said dielectric film is formed with a desired final composition absent a post deposition step.

2. The method of claim 1, wherein said silicon source comprises a molecular structure absent carbon.

3. The method of claim 1, wherein said silicon source comprises a molecular structure absent chlorine.

4. The method of claim 1, wherein said silicon source is the vapor phase in the delivery system.

5. The method of claim 1, absent a step wherein said silicon source is vaporized.

6. The method of claim 1, absent a step wherein said silicon source is delivered by bubbling a gas through a liquid silicon source.

7. The method of claim 1, wherein said silicon source has a vapor pressure of at least about 50 torr at 20° C.

8. The method of claim 1, wherein said silicon source is selected from the group consisting of trisilylamine, disilylamine, silylamine, tridisilylamine, aminodisilylamine, tetrasilyldiamine, disilane, derivatives of disilane, and mixtures thereof.

9. The method of claim 1, wherein said silicon source is trisilylamine.

10. The method of claim 1, wherein said oxygen source comprises a molecular structure absent carbon.

11. The method of claim 1, wherein said oxygen source comprises a molecular structure absent chlorine.

12. The method of claim 1, wherein said oxygen source is selected from the group consisting of oxygen, nitrous oxide, ozone, and mixtures thereof.

13. The method of claim 1, wherein said nitrogen source comprises a molecular structure absent carbon.

14. The method of claim 1, wherein said nitrogen source comprises a molecular structure absent chlorine.

15. The method of claim 1, wherein said nitrogen source is the same as said metal source, said silicon source, or said oxygen source.

16. The method of claim 1, wherein said nitrogen source is ammonia.

17. The method of claim 1, wherein said metal source is selected from the group consisting of a dialkylamino, and alkoxy.

18. The method of claim 1, wherein said metal source is an inorganic compound selected from the group consisting of hafnium (Hf), zirconium (Zr), lanthanum (La), yitrium (Y), gadolinium (Gd), europium (Eu), praseodymium (Pr), and mixtures thereof.

19. The method of claim 1, wherein the amounts of said metal source and said silicon source in said desired final composition of said dielectric film are independently controllable.

20. The method of claim 1, wherein said forming a dielectric film step is completed using a chemical vapor deposition process.

21. The method of claim 1, wherein said forming a dielectric film step is completed using an atomic layer deposition process.

* * * * *